United States Patent
Kim et al.

(10) Patent No.: US 7,902,544 B2
(45) Date of Patent: Mar. 8, 2011

(54) NITRIDE SEMICONDUCTOR LIGHT EMITTING DEVICE

(75) Inventors: Sun Woon Kim, Seoul (KR); Je Won Kim, Kyungki-do (KR); Sang Won Kang, Kyungki-do (KR); Keun Man Song, Seoul (KR); Bang Won Oh, Kyungki-do (KR)

(73) Assignee: Samsung LED Co., Ltd, Gyunggi-Do (KR)

( * ) Notice: Subject to any disclaimer, the term of this patent is extended or adjusted under 35 U.S.C. 154(b) by 0 days.

(21) Appl. No.: 12/787,910

(22) Filed: May 26, 2010

(65) Prior Publication Data
US 2010/0230657 A1  Sep. 16, 2010

Related U.S. Application Data

(62) Division of application No. 11/581,335, filed on Oct. 17, 2006, now Pat. No. 7,829,882.

(30) Foreign Application Priority Data

Oct. 17, 2005 (KR) ........................ 10-2005-0097623

(51) Int. Cl.
*H01L 33/00* (2010.01)
(52) U.S. Cl. ................ 257/13; 257/14; 257/94; 257/103
(58) Field of Classification Search ............. 257/12–19, 257/94–103, E33.072
See application file for complete search history.

(56) References Cited

U.S. PATENT DOCUMENTS

| | | | |
|---|---|---|---|
| 5,583,878 A | 12/1996 | Shimizu et al. | |
| 6,153,894 A | 11/2000 | Udagawa | |
| 6,593,597 B2 | 7/2003 | Sheu | |
| 2002/0179923 A1 | 12/2002 | Morita et al. | |
| 2003/0001170 A1 | 1/2003 | Shibata et al. | |
| 2008/0023689 A1* | 1/2008 | Kim et al. | 257/13 |
| 2008/0023690 A1* | 1/2008 | Moon | 257/13 |
| 2008/0315179 A1* | 12/2008 | Kim et al. | 257/13 |
| 2010/0044674 A1* | 2/2010 | Kim | 257/13 |
| 2010/0123119 A1* | 5/2010 | Kim et al. | 257/13 |

FOREIGN PATENT DOCUMENTS

| | | |
|---|---|---|
| JP | 7-74431 | 3/1995 |
| JP | 2002-368268 | 12/2002 |

OTHER PUBLICATIONS

Japanese Office Action issued in Japanese Patent Application No. 2006-272045, dated Oct. 23, 2009.

* cited by examiner

*Primary Examiner* — Cuong Q Nguyen
(74) *Attorney, Agent, or Firm* — McDermott Will & Emery LLP

(57) ABSTRACT

The invention provides a highly reliable nitride semiconductor light emitting device improved in electrostatic discharge withstand voltage. In the light emitting device, an n-type nitride semiconductor layer, an active layer and a p-type nitride semiconductor layer are sequentially formed on a substrate. The active layer features a multiple quantum well structure including a plurality of multiple quantum barrier layers and quantum well layers. At least one of the quantum barrier layers has a band-gap modulated multilayer structure.

7 Claims, 11 Drawing Sheets

NITRIDE SEMICONDUCTOR LIGHT EMITTING DEVICE

RELATED APPLICATION

This application is a Divisional of U.S. patent application Ser. No. 11/581,335, filed on Oct. 17, 2006 now U.S. Pat. No. 7,829,882, and claims the benefit of Korean Patent Application No. 2005-97623 filed on Oct. 17, 2005, in the Korean Intellectual Property Office, the entire contents of each of which are hereby incorporated by reference.

BACKGROUND OF THE INVENTION

1. Field of the Invention

The present invention relates to a nitride semiconductor light emitting device, more particularly, which is highly resistant to Electrostatic Discharge (ESD).

2. Description of the Related Art

Recently, a group III-V nitride semiconductor (hereinafter "nitride semiconductor") has been broadly used as a light emitting diode (LED) for emitting blue or green wavelength light or a semiconductor material for a laser diode (LD). The nitride semiconductor also has found applications as a light source of various products such as natural color display boards, traffic lights, image scanners and lighting devices. Here the nitride semiconductor device denotes a GaN-based semiconductor material having a composition expressed by $In_xAl_yGa_{1-x-y}N$, where $0 \leq x \leq 1$, $0 \leq y \leq 1$ and $0 \leq x+y \leq 1$. In utilizing this nitride semiconductor device, greater significance has been imparted not only to light emitting capability but also reliability thereof. The nitride semiconductor light emitting device is typically susceptible to Electrostatic Discharge (ESD), especially reverse ESD. Thus ESD withstand voltage of the light emitting device is a determinant factor of reliability.

Various studies have been conducted to suppress ESD-induced damage to the nitride semiconductor light emitting device. For example, in a conventional method, a GaN-based LED is connected in parallel to a Si-based zener diode to prevent the light emitting device from ESD. However, such a method requires a separate zener diode to be bonded and assembled, thereby considerably increasing material and process costs and hampering miniaturization thereof. In another conventional method, U.S. Pat. No. 6,593,597 discloses a technology of integrating an LED device and a Schottky diode on the same substrate and connecting them in parallel with each other to protect the light emitting device from ESD.

FIG. 1 is a cross-sectional view illustrating a conventional nitride semiconductor light emitting device having a Schottky diode installed therein. Referring to FIG. 1, the light emitting device (LED) includes buffer layers 12a and 12b, a first n-type nitride semiconductor layer 14a, an active layer 18, a p-type nitride semiconductor layer 22, a transparent electrode 24 and an n-electrode 26 formed sequentially on a sapphire substrate 11. Also, the Schottky diode is formed separate from the LED structure on the sapphire substrate 11. The Schottky diode includes a second n-type nitride semiconductor layer 14b, a Schottky contact electrode 28 and an ohmic contact electrode 30.

The transparent electrode of the LED structure is connected to the ohmic contact electrode 30 and the n-electrode 26 of the LED structure is connected to the Schottky contact electrode 28. Accordingly, the LED structure is connected in parallel to the Schottky diode. In the light emitting device structured above, reverse ESD applied may be discharged through the Schottky diode. Therefore, with the reverse ESD voltage applied, most current flows through the Schottky diode in place of the LED diode, shielding the LED structure from ESD.

Yet, this method for shielding ESD via the Schottky diode cumbersomely requires a separate Schottky contact to be made, increasing manufacturing costs of the device. That is, the LED device area should be separated from the Schottky diode area. Moreover, an electrode material for forming the Schottky contact and an electrode material for forming an ohmic contact should be deposited separately on the second n-type nitride semiconductor 14b made of an n-type GaN-based material.

SUMMARY OF THE INVENTION

The present invention has been made to solve the foregoing problems of the prior art and therefore an object according to certain embodiments of the present invention is to provide a nitride semiconductor light emitting device having a stronger ESD withstand voltage through an improved LED multilayer structure.

According to an aspect of the invention for realizing the object, there is provided a nitride semiconductor light emitting device including: an n-type nitride semiconductor layer, an active layer and a p-type nitride semiconductor layer sequentially formed on a substrate, wherein the active layer comprises a multiple quantum well structure including a plurality of quantum barrier layers and quantum well layers, and wherein at least one of the quantum barrier layers has a band-gap modulated multilayer structure.

According to the invention, the multilayer structure has a composition expressed by $In_xAl_yGa_{1-x-y}N$, where $0 \leq x \leq 1$, $0 \leq y \leq 1$ and $0 \leq x+y \leq 1$. The multilayer structure comprises multiple layers, at least some of which are n-doped. The multilayer structure comprises multiple layers doped with different concentrations. Preferably, the multilayer structure comprises multiple layers each having a thickness ranging from 0.2 nm to 5 nm.

According to an embodiment of the invention, the multilayer structure comprises two types of layers with different band gaps, the two types of layers stacked repeatedly. The two types of layers with different band gaps have different compositions.

The multilayer structure comprises first nitride semiconductor layers with a first band gap and second nitride semiconductor layers with a second band gap smaller than the first band gap, the first and second semiconductor layers stacked alternately, the first nitride semiconductor layers having a composition expressed by $In_xAl_yGa_{1-x-y}N$, where $0 \leq x \leq 1$, $0 \leq y \leq 1$ and $0 \leq x+y \leq 1$ and the second nitride semiconductor layers having a composition expressed by $In_mAl_nGa_{1-m-n}N$, where $0 \leq n \leq 1$, $0 \leq m \leq 1$ and $0 \leq m+n \leq 1$. For example, the multilayer structure comprises first and second layers with different band gaps, the first and second layers stacked alternately, the first layers having a composition expressed by $In_xGa_{1-x}N$, where $0 \leq x < 1$ and the second layers having a composition expressed by $In_mGa_{1-m}N$, where $0 < m \leq 1$ and $x < m$.

At least one type of the first and second nitride semiconductor layers has compositional change. For example, the second nitride semiconductor layers are made of InGaN, an In content increased by proximity to the p-type nitride semiconductor layer. On the contrary, the second nitride semiconductor layers are made of InGaN, In content decreased by proximity to the p-type nitride semiconductor layer.

According to another embodiment of the invention, the multilayer structure comprises at least two stacks of layer groups, each of the layer groups including at least two layers with different band gaps. Here, the layer groups are doped with different concentrations. Also, the layer groups have band-gaps modulated differently.

For example, the multilayer structure comprises at least two stacks of layer groups, each of the layer groups including a first-nitride semiconductor layer having a first band gap, a second nitride semiconductor layer having a second band gap smaller than the first band gap and a third semiconductor layer having a third band gap smaller than the second band gap.

According to a preferred embodiment of the invention, the multilayer structure is disposed only in one or two of the quantum barrier layers adjacent to the n-type nitride semiconductor layer, the one or two quantum barrier layers interleaved between the quantum well layers. Here, the active layer may start either from the quantum well layer or from the quantum well layer on a top surface of the n-type nitride semiconductor layer.

According to further another embodiment of the invention, at least two of the quantum barrier layers each has a band-gap modulated multilayer structure, and the multilayer structures of the at least two quantum barrier layers are identical with each other. Alternatively, at least two of the quantum barrier layers each has a band-gap modulated multilayer structure, wherein the multilayer structures of the at least two quantum barrier layers are different from each other. For example, the at least two quantum barrier layers with the multilayer structures have different compositions or are band-gap modulated differently.

According to the invention, some quantum barrier layers with an active layer are constructed of a band-gap modulated multilayer structure, thereby achieving stronger current spreading effect. This current spreading effect prevents current from being crowded locally and enhances properties of electrostatic discharge withstand voltage. In the end, the invention obviates a need for bonding a separate stack structure, zener diode or Schottky diode but sufficiently shields the LED device from ESD, thus advantageously simplifying a manufacturing process and reducing manufacturing costs.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
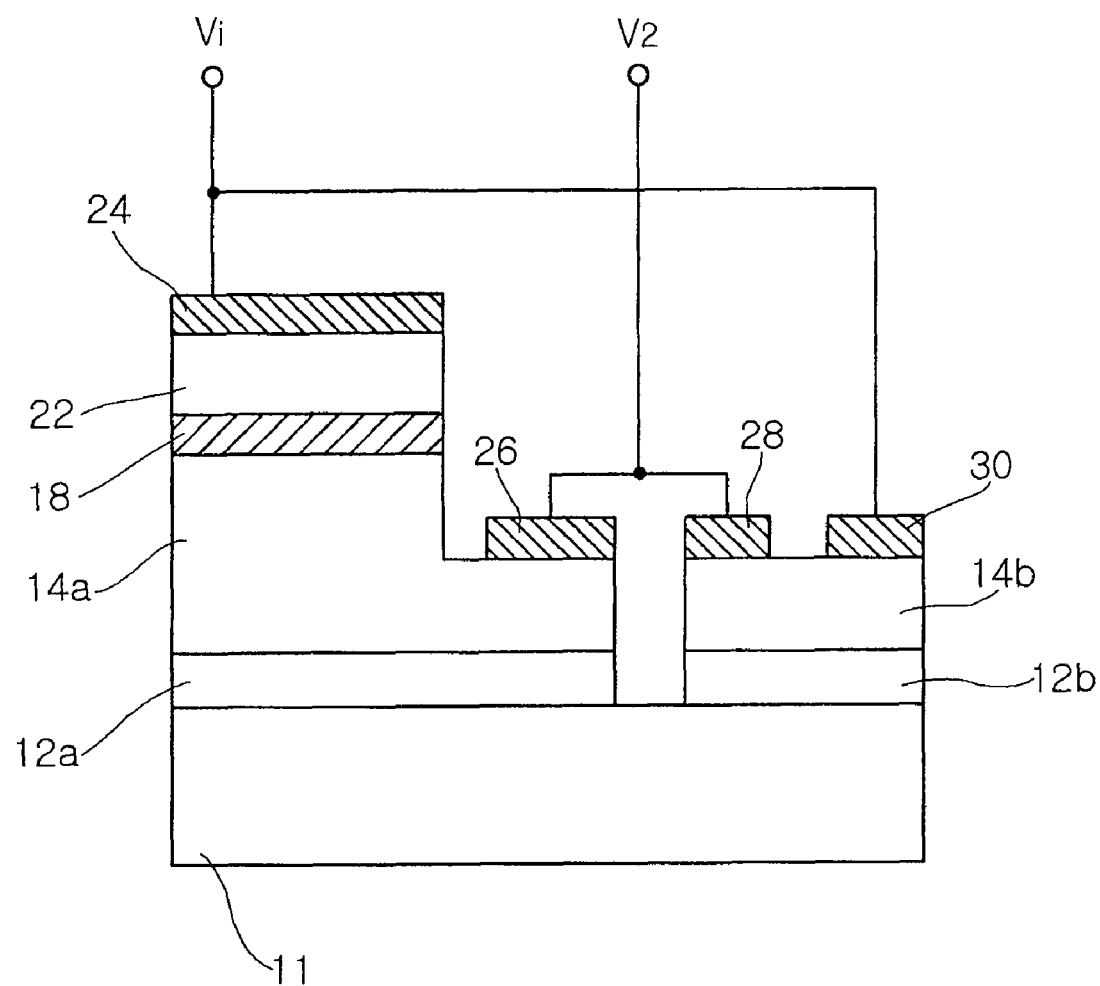
FIG. 1 is a cross-sectional view illustrating a conventional nitride semiconductor device.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
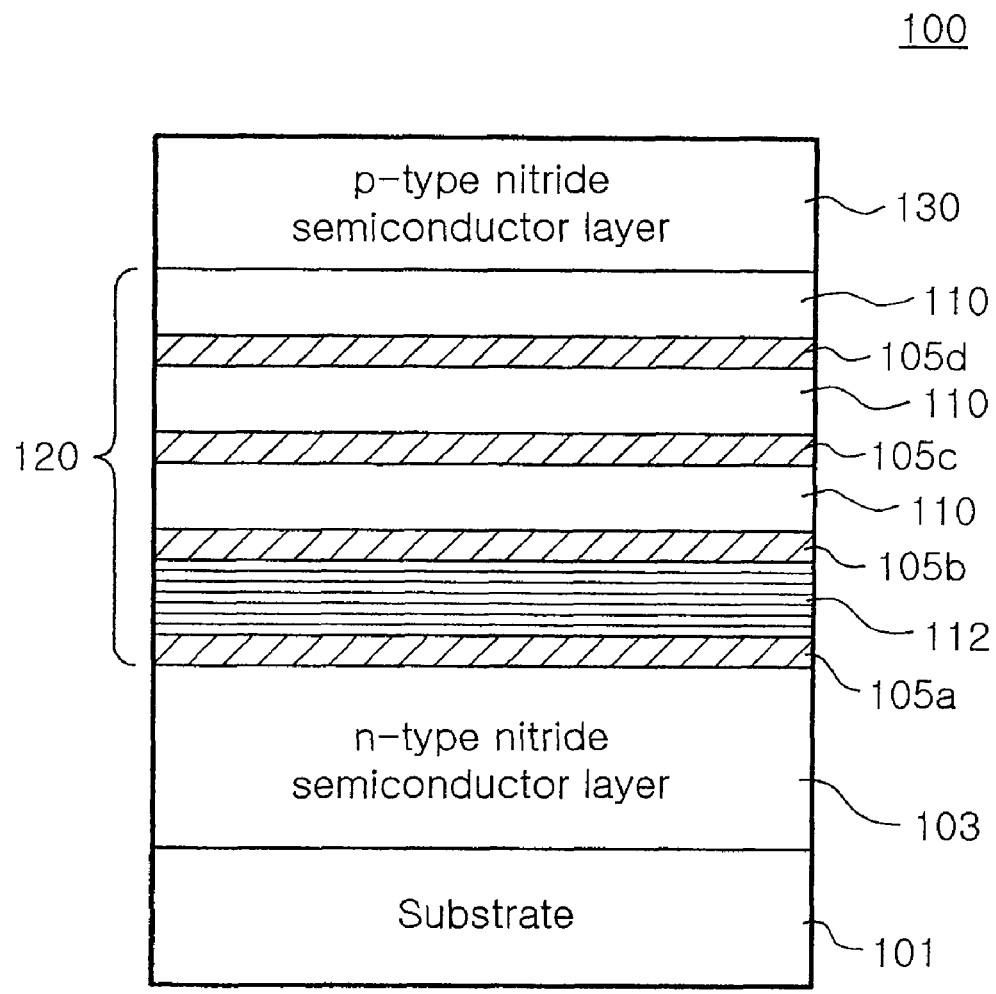
FIG. 2 is a cross-sectional view illustrating a nitride semiconductor light emitting device according to an embodiment of the invention.

FIG. 2 is a cross-sectional view illustrating a nitride semiconductor light emitting device according to an embodiment of the invention. Referring to FIG. 2, the light emitting device 100 includes an n-type nitride semiconductor layer 103, an active layer 120 and a p-type nitride semiconductor layer 130 sequentially formed on a substrate 101 of e.g. sapphire. An electrode structure of the light emitting device 100 is not illustrated for the sake of convenience. The active layer 120 is constructed of a multiple quantum well structure. That is, the active layer includes quantum well layers 105a, 105b, 105c and 105d and quantum barrier layers 112 and 110 stacked alternately. Moreover, at least one 112 of the quantum barrier layers 112 and 110 has a band-gap modulated multilayer structure. FIG. 5 to FIG. 8 illustrate exemplary energy band structures of the active layer including the quantum barrier layer 112 constructed of a band-gap modulated multilayer structure.

According to the invention, the at least one 112 quantum barrier layer 112 in the active layer 120 features the band-gap modulated multilayer structure, thereby further ensuring current to spread laterally. This current spreading effect prevents current from being crowded locally and the light emitting device from suffering damage from ESD. This accordingly improves ESD withstand voltage of the nitride semiconductor light emitting device 100 without a separate zener diode or Schottky contact.

As shown in FIG. 2, the multilayer structure is disposed in the quantum barrier layer 112 which is in the closest vicinity of the n-type nitride semiconductor layer 103 out of the quantum barrier layers 112 and 110 interleaved between the quantum well layers. In general, preferably, the quantum barrier layer of the band-gap modulated multilayer structure is inserted between the quantum well layers. Especially, the multilayer structure is disposed only in one or two quantum barrier layers interleaved between the quantum well layers. This enhances electrostatic withstand voltage and prevents degradation in brightness.

Figure 9:
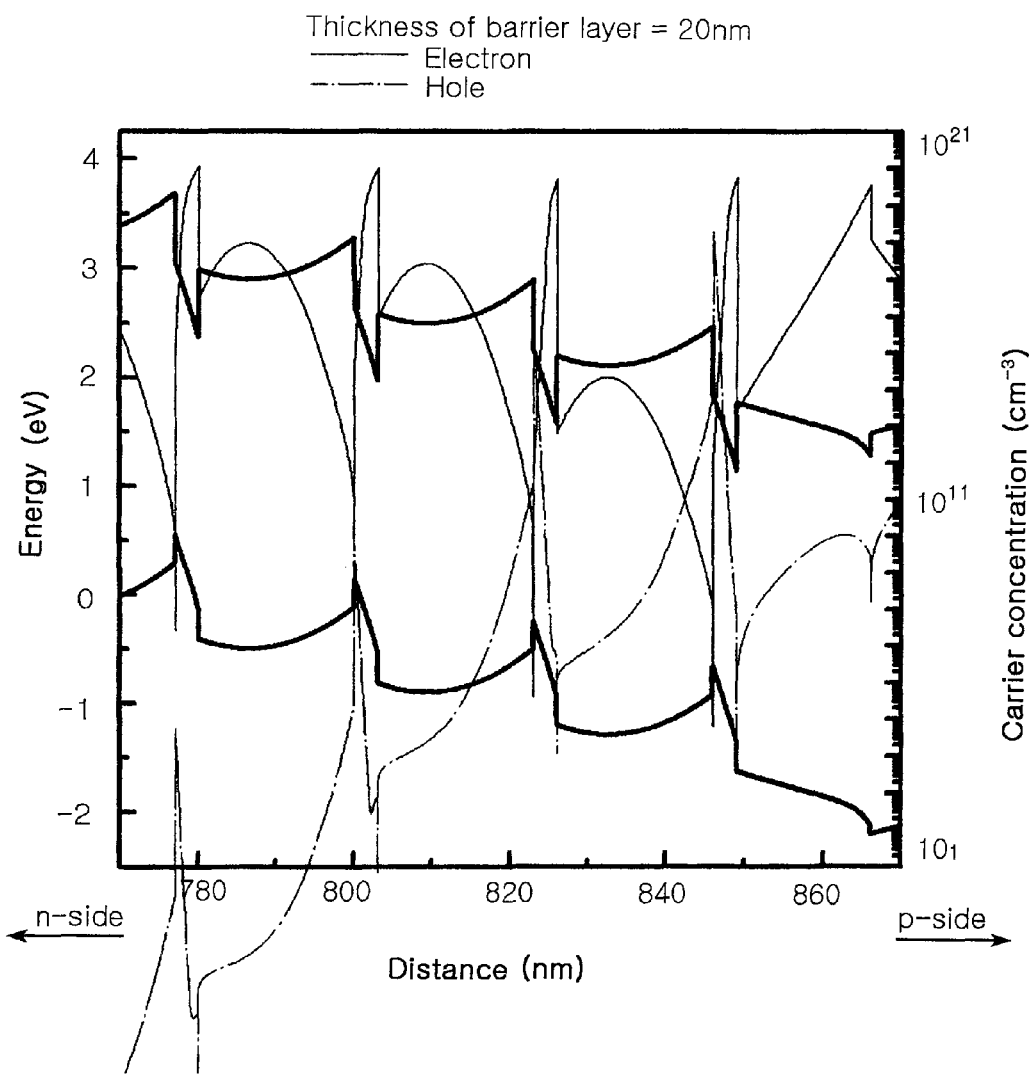
FIG. 9 is a graph illustrating concentration distribution of electrons and holes in the active layer.
Figure 10:
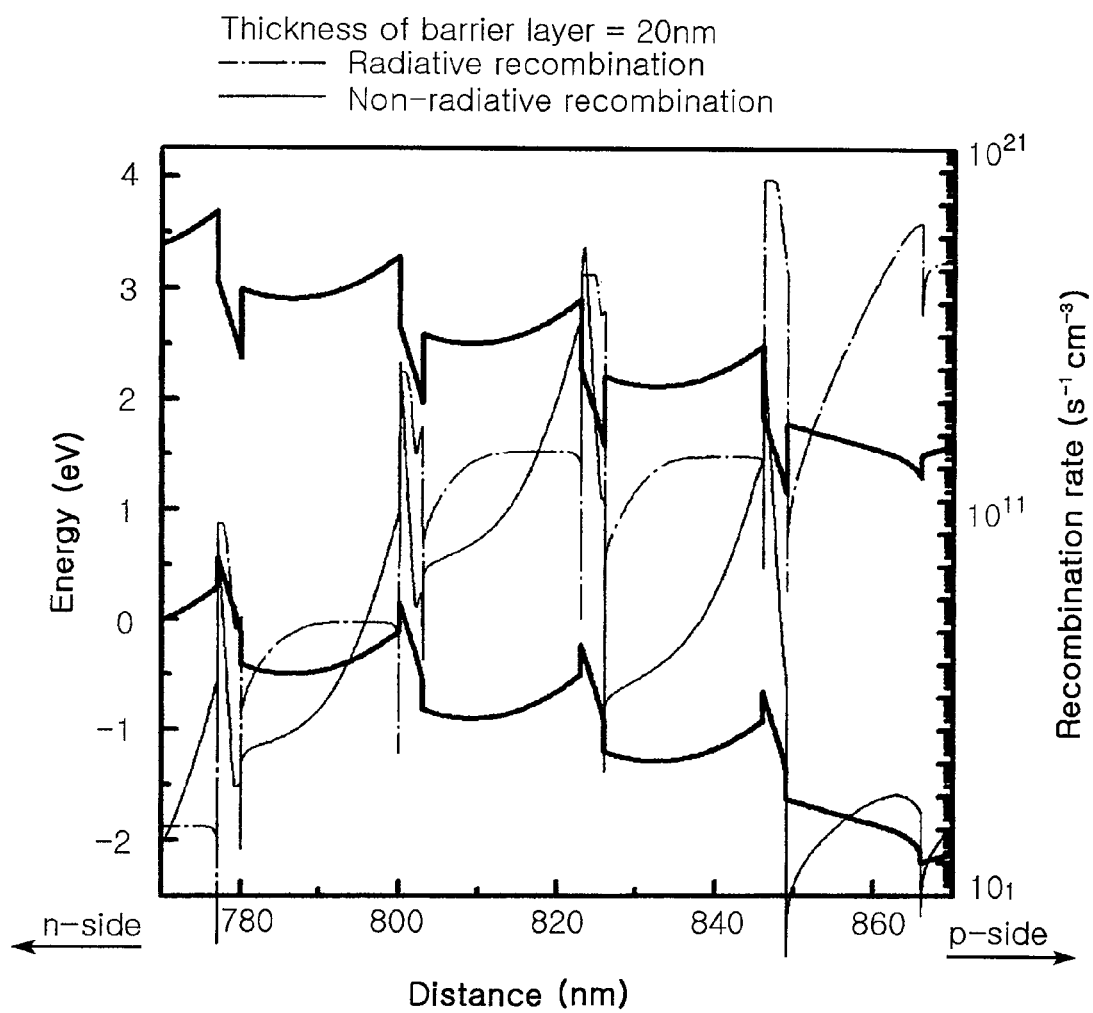
FIG. 10 is a graph illustrating recombination efficiency in the active layer.

In a further explanation, typically, in the active layer, electrons are much more concentrated and mobile than holes. Consequently, electron-hole recombination, particularly, radiative recombination for light emission, mostly occurs in the well layer which is adjacent to the p-type nitride semiconductor layer 130. That is, proximity to an n-side (i.e. the n-type nitride semiconductor layer 103) significantly reduces radiative recombination. This is confirmed by graphs of FIGS. 9 and 10. FIG. 9 is a graph illustrating concentration distribution of electrons and holes in the active layer and FIG. 10 is a graph illustrating recombination rate distribution in the active layer.

As shown in FIG. 9, generally, electrons are more populated than holes in the active layer. Also, in the quantum well layers, electrons are present at a similar concentration. On the other hand, since holes are significantly less mobile than electrons, most holes are present in one of the quantum well layers, which is in the close vicinity of a p-side (i.e. the p-type nitride semiconductor layer). Also, proximity to the n-side (i.e. the n-type nitride semiconductor layer) steeply decreases concentration of holes. Accordingly, as shown in FIG. 10, radiative recombination mostly arises in the quantum well layer close to the p-type nitride semiconductor layer (p-side).

In this fashion, radiative recombination mostly takes place in the quantum well layer adjacent to the p-type nitride semiconductor layer. As a result, even when the quantum barrier layer in the close vicinity of the n-type nitride semiconductor layer (n-side) is constructed of the band-gap modulated multilayer structure, electrostatic discharge withstand voltage is effectively improved without noticeable decrease in light emitting efficiency and brightness.

The barrier layer 112 of the multilayer structure is made of a semiconductor material having a composition expressed by $In_xAl_yGa_{1-x-y}N$, where $0 \leq x \leq 1$, $0 \leq y \leq 1$ and $0 \leq x+y \leq 1$. The multilayer structure includes multiple layers, at least some of which are n-doped. This n-doping increases electrical conductivity and reduces operation voltage thereof. Here, the multiple layers each are doped with equal or different concentrations. Alternatively, some of the multiple layers are doped with equal concentrations and others are doped with different concentrations. Especially, the barrier layer may be constructed of the multilayer structure having high-doped and low-doped multilayer layers stacked alternately, thereby boosting current spreading effect further.

The multiple layers of the multilayer structure 112 each have an equal or different thickness. Preferably, the multiple layers of the multilayer structure 112 each have a thickness ranging from 0.2 nm to 5 nm. More preferably, the multiple layers of the multilayer structure 112 each have a thickness ranging from 0.5 nm to 5 nm.

In the embodiment of FIG. 2, the active layer begins from the quantum well layer 105a on the n-type nitride semiconductor layer. But the invention is not limited thereto. The active layer may start from the quantum barrier layer on the n-type nitride semiconductor layer.

Figure 3:
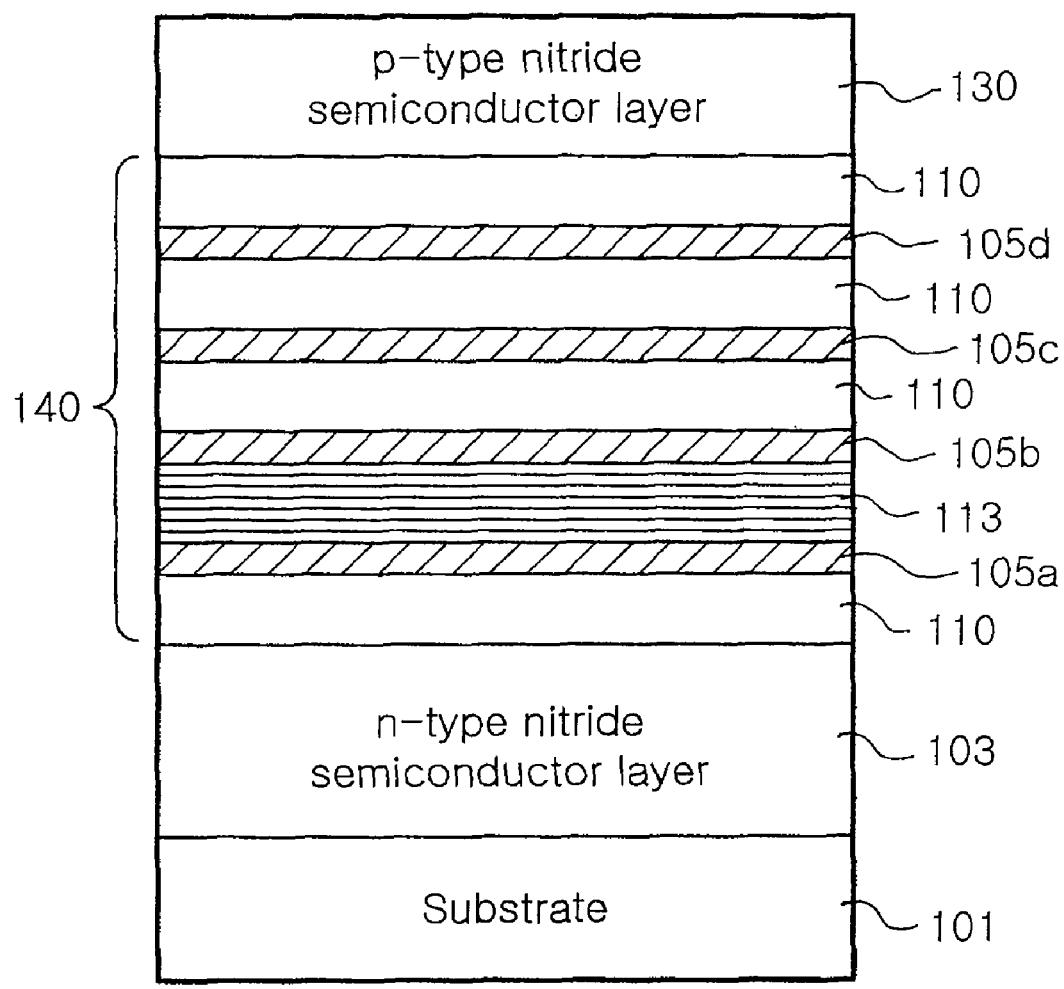
FIG. 3 is a cross-sectional view illustrating a nitride semiconductor device according to another embodiment of the invention.
Figure 4:
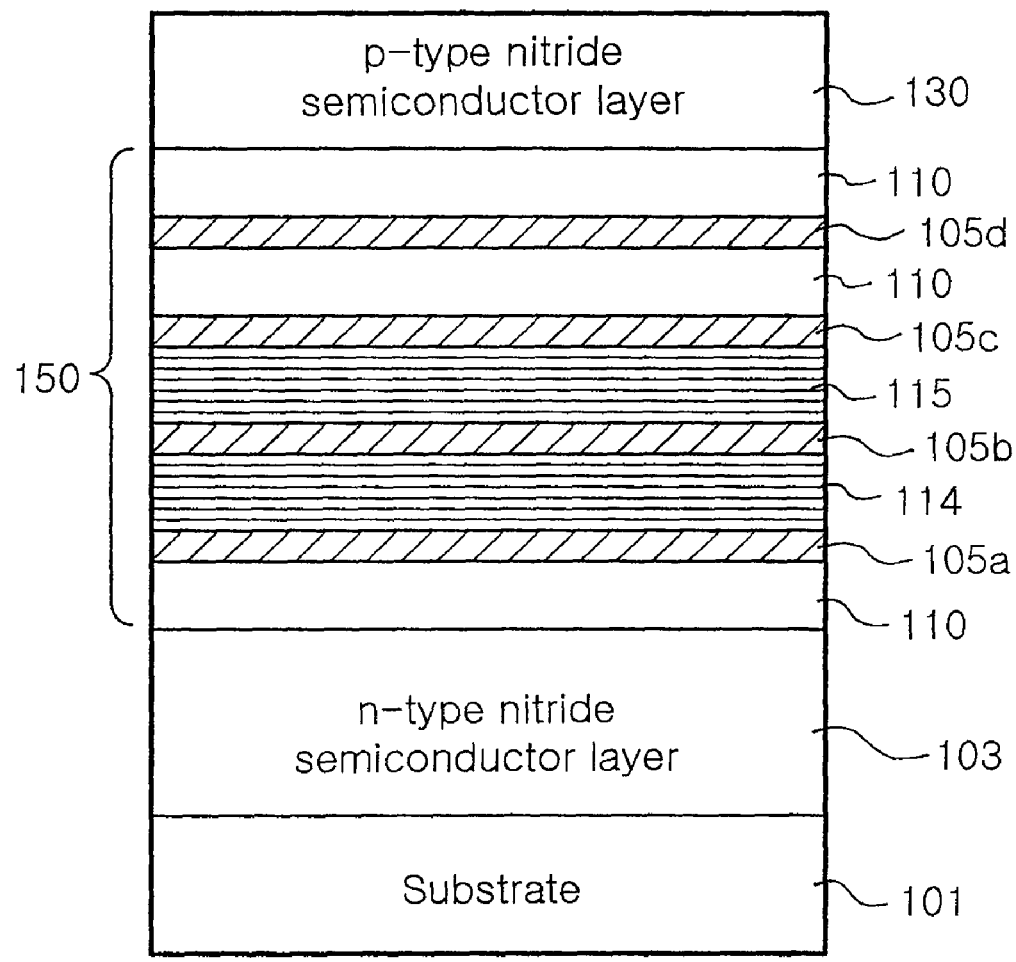
FIG. 4 is a cross-sectional view illustrating a nitride semiconductor light emitting device according to further another embodiment of the invention.

FIGS. 3 and 4 are cross-sectional views illustrating a nitride semiconductor light emitting device according to other embodiments of the invention. In the light emitting device 200 and 300 of FIGS. 3 and 4, an active layer 140 and 150 starts from a quantum barrier layer on an n-type nitride semiconductor layer 103. In the nitride semiconductor device 200, quantum barrier layers 110 and 113 are inserted between quantum well layers 105a, 105b, 105c and 105d. Here, especially, only one quantum barrier layer 113 adjacent to the n-type nitride semiconductor layer 103 is constructed of a band-gap modulated multilayer structure. Likewise, in the nitride semiconductor light emitting device 300 of FIG. 4, quantum barrier layers 110, 114 and 115 are interleaved between quantum well layers 105a, 105b, 105c, 105c and 105d. But, here, only two quantum barrier layers 114 and 115 adjacent to an n-type nitride semiconductor layer 103 are constructed of a band-gap modulated multilayer structure.

As in the light emitting device 400 of FIG. 4, in a case where at least two quantum barrier layers 114 and 115 feature a multilayer structure, multilayer structures of the quantum barrier layers 114 and 115 are identical with each other. Alternatively, the multilayer structures of the quantum barrier layers 114 and 115 are different from each other in view of strains in the multilayer structure. For example, the quantum barrier with the multilayer structures 114 and 115 have different compositions or are band-gap modulated differently.

FIGS. 5 to 8 are conduction band edge diagrams of an active layer according to various embodiments of the invention. FIGS. 5 to 8 illustrate exemplary energy band structures of a quantum barrier layer constructed of a multilayer structure.

Figure 5:
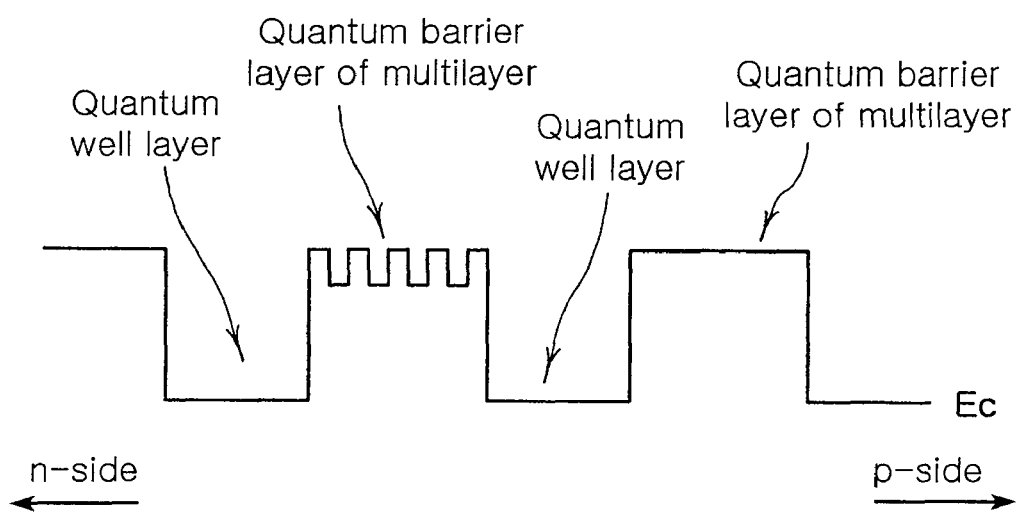
FIGS. 5 to 8 are conduction band edge diagrams of an active layer for schematically explaining a multiple quantum well structure of the active layer according to various embodiments of the invention.

First, referring to FIG. 5, the multilayer structure has at least two types of layers with different band gaps stacked repeatedly. To obtain the quantum barrier layer of the multilayer structure in FIG. 5, first nitride semiconductor layers having a first band gap and second nitride semiconductor layers having a second band gap greater than the first band gap are stacked alternately with each other. Here, the first nitride semiconductor layers have a composition expressed by $In_xAl_yGa_{1-x-y}N$, where $0 \leq x \leq 1$, $0 \leq y \leq 1$ and $0 \leq x+y \leq 1$ and the second nitride semiconductor layer have a composition expressed by $In_mAl_nGa_{1-m-n}N$, where $0 \leq n \leq 1$, $0 \leq m \leq 1$ and $0 \leq m+n \leq 1$. For example, layers having a composition expressed by $In_xGa_{1-x}N$, where $0 \leq x < 1$ and layers having a composition expressed by $In_mGa_{1-m}N$, where $0 < m \leq 1$ and $x < m$ are stacked alternately with each other. This produces the band-gap modulated multilayer structure in FIG. 5. Here, out of $In_xGa_{1-x}N$, and $In_mGa_{1-m}N$, the $In_mGa_{1-m}N$ layer has a higher In content, thereby exhibiting a smaller band gap.

Figure 6:
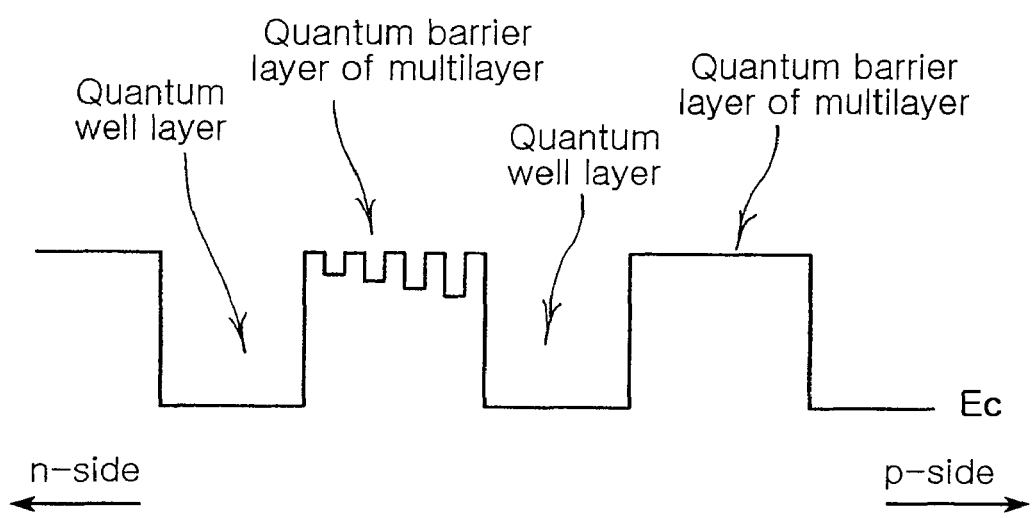

Referring to FIG. 6, a quantum barrier layer of a multilayer structure includes first and second nitride semiconductor layers with different band gaps (the first nitride semiconductor layers have a band gap greater than the second nitride semiconductor layers). The first and second layers are stacked repeatedly. Here, the second nitride semiconductor layers may be changed in their composition such that a band gap of the second nitride semiconductor layers is decreased by proximity to the p-side (toward the p-type semiconductor layer). For example, the second nitride semiconductor layers are constructed of an InGaN layer, in which In content is increased by proximity to the p-side.

Figure 7:
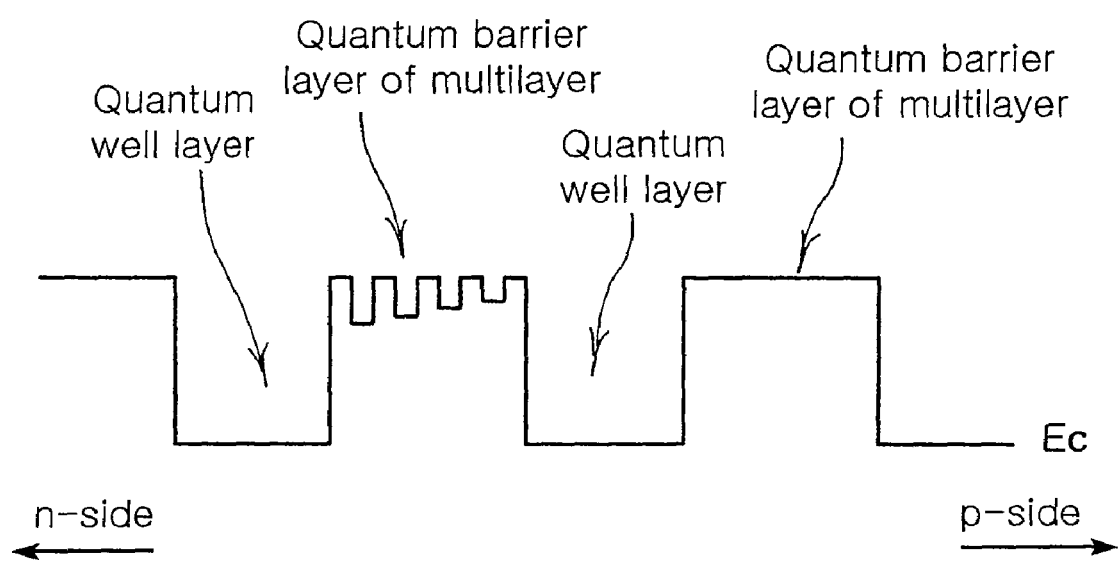

As shown in FIG. 7, the second nitride semiconductor layers are changed in their composition such that the band gap thereof is increased by proximity to the p-side, as opposed to FIG. 6. For example, the second nitride semiconductor layers are made of InGaN, in which In content is decreased by proximity to the p-side. Alternatively, the first nitride semiconductor layers may have compositional change. In this fashion, at least one type of the first and second nitride semiconductor layers of the multilayer structure may have compositional change, which is not however limited to the examples of FIGS. 5 to 7.

Figure 8:
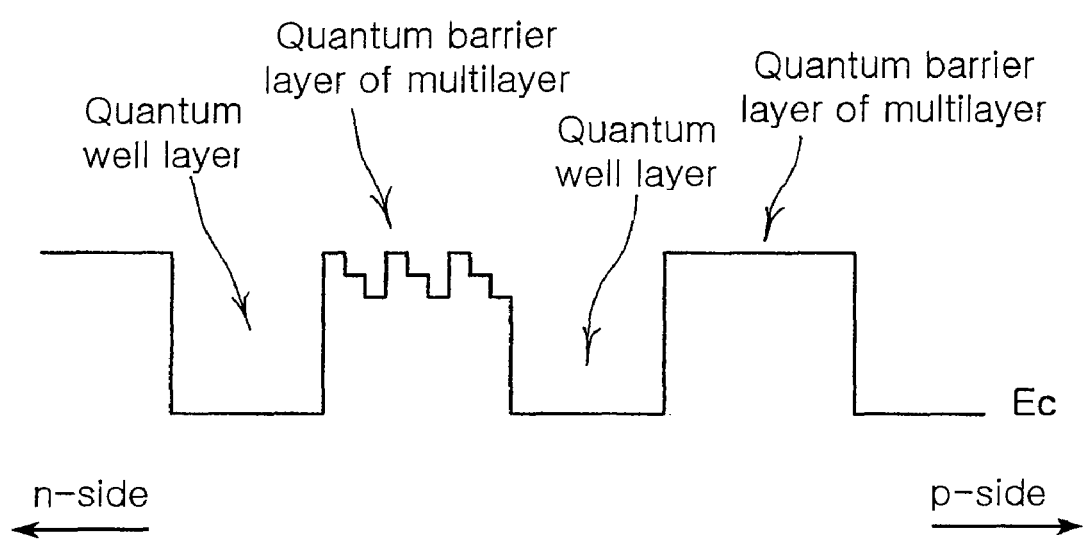

FIG. 8 is an energy band structure diagram illustrating a quantum barrier layer of a multilayer structure according to further another embodiment of the invention. Referring to FIG. 8, the multilayer structure includes at least two stacks of layer groups. Here, each of the layer groups includes three layers with different band gaps (first to third nitride semiconductor layers).

In a more specific explanation, the multilayer structure includes at least two stacks of layer groups. Here, each of the layer groups includes the first nitride semiconductor layer having a first band gap, the second nitride semiconductor layer having a second band gap and a third nitride semiconductor layer having a third band gap (where the first band gap>the second band gap>the third band gap). Especially, in the embodiment of FIG. 8, the the layer groups each are band-gap modulated equally. Yet the invention is not limited thereto and the layer groups each may be band-gap modulated differently. Furthermore, the layer groups each may have different compositions (i.e. cyclically unrepeated composition).

Also in the embodiment of FIG. 8, the quantum barrier layers of the multilayer structure are at least partially n-doped. Here, the layer groups each are doped with either equal or different concentrations. Alternatively, some of the layer groups are doped with equal concentrations and the others are doped with different concentrations. For example, doped and undoped ones of the layer groups may stack alternate each other. In this embodiment, one layer group of the multilayer structure includes three nitride semiconductor layers with different band gaps but may include two or at least four nitride semiconductor layers with different band gaps.

According to the invention, some of the quantum barrier layers (preferably, one or two of the quantum barrier layers adjacent to the n-type nitride semiconductor layer) are constructed of the band-gap modulated multilayer structure, thereby remarkably enhancing properties of ESD withstand voltage properties without impairing brightness and light emitting efficiency. This advantage is well manifested in the graph illustrated in FIG. 11.

Figure 11:
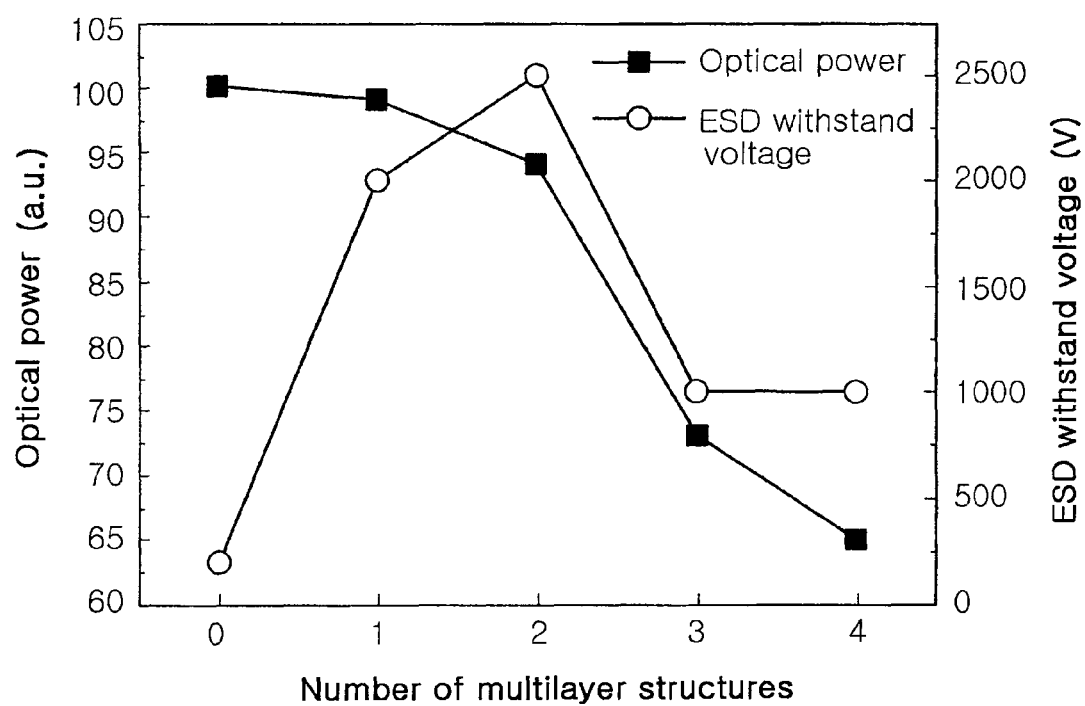
FIG. 11 is a graph illustrating optical power and ESD withstand voltage in accordance with the number of quantum barrier layers constructed of a multilayer structure.

Referring to FIG. 11, with increase in the number of quantum barrier layers having the band-gap modulated multilayer structure, which are stacked from the closest vicinity of the n-type nitride semiconductor layer (also interposed between the quantum well layers), optical power (brightness) is gradually declined, while ESD withstand voltage is drastically increased and slightly decreased. The optical power is decreased as the quantum barrier layers of the multilayer structure are disposed closer to the p-side. This is because radiative recombination mostly occurs in the quantum well layer adjacent to the p-type nitride semiconductor layer.

A graph of FIG. 11 confirms that ESD withstand voltage can be increased by employing the quantum barrier layer constructed of a band-gap modulated multilayer structure. Moreover, the multilayer structure is disposed only in one or two of the quantum barrier layers adjacent to the n-type nitride semiconductor layer out of the quantum barrier layers interleaved between the quantum well layers. This noticeably prevents decline in brightness. Therefore, the multilayer structure disposed only in one or two of the quantum barrier layers adjacent to the n-side (see FIGS. 2 to 4) ensures adequate brightness and improves properties of ESD withstand voltage.

However, if all the quantum barrier layers including the one adjacent to the p-side feature the band-gap modulated multilayer structure, brightness is reduced. That is, since the band gap-modulated multilayer structure is disposed near the quantum well layers where radiative recombination mostly arises, light emitting efficiency is degraded. Therefore, the band-gap modulated multilayer structure should be disposed in only some of the quantum barrier layers. Especially, the multilayer structure should be disposed in the quantum barrier layer adjacent to the n-type nitride semiconductor layer, thereby advantageously preventing reduction in brightness.

As set forth above, according to preferred embodiments of the invention, some of quantum barrier layers are constructed of a band-gap modulated multilayer structure, thereby boosting current spreading effect and ESD withstand voltage. Furthermore, the invention enhances ESD withstand voltage easily without a separate zener diode or Schottky contact, thereby manufacturing a highly reliable nitride semiconductor light emitting device at lower costs.

What is claimed is:

1. A nitride semiconductor light emitting device comprising: an n-type nitride semiconductor layer, an active layer and a p-type nitride semiconductor layer sequentially formed on a substrate,
    wherein the active layer comprises a multiple quantum well structure including a plurality of quantum barrier layers and quantum well layers,
    wherein at least one of the quantum barrier layers has a band-gap modulated multilayer structure;
    wherein the band-gap modulated multilayer structure comprises at least two stacks of layer groups, each of the layer groups including a first nitride semiconductor layer having a first band gap, a second nitride semiconductor layer having a second band gap smaller than the first band gap and a third semiconductor layer having a third band gap smaller than the second band gap.

2. The nitride semiconductor light emitting device according to claim 1, wherein the band-gap modulated multilayer structure comprises multiple layers, at least some of which are n-doped.

3. The nitride semiconductor light emitting device according to claim 1, wherein the band-gap modulated multilayer structure comprises multiple layers doped with different concentrations.

4. The nitride semiconductor light emitting device according to claim 1, wherein the band-gap modulated multilayer structure comprises multiple layers each having a thickness ranging from 0.2 nm to 5 nm.

5. The nitride semiconductor light emitting device according to claim 1, wherein at least two of the quantum barrier layers each has the band-gap modulated multilayer structure, and
    wherein the band-gap modulated multilayer structures of the at least two quantum barrier layers are identical with each other.

6. The nitride semiconductor light emitting device according to claim 1, wherein at least two of the quantum barrier layers each has the band-gap modulated multilayer structure,
    wherein the band-gap modulated multilayer structures of the at least two quantum barrier layers are different from each other.

7. The nitride semiconductor light emitting device according to claim 6, wherein the at least two quantum barrier layers with the multilayer structures have different compositions or are band-gap modulated differently.

* * * * *